US005209818A

United States Patent [19]
Bol

[11] Patent Number: 5,209,818
[45] Date of Patent: May 11, 1993

[54] MANUFACTURE OF A MICROMECHANICAL ELEMENT WITH TWO DEGREES OF FREEDOM

[75] Inventor: Igor I. Bol, Sherman Oaks, Calif.

[73] Assignee: Xerox Corporation, Stamford, Conn.

[21] Appl. No.: 725,173

[22] Filed: Jul. 3, 1991

[51] Int. Cl.$^5$ .................. H01L 21/306; B44C 1/22; C03C 15/00; C23F 1/00
[52] U.S. Cl. .................... 156/651; 156/653; 156/656; 156/657; 156/659.1; 156/662; 437/228; 437/233; 437/238; 437/241
[58] Field of Search ............... 156/651, 653, 656, 657, 156/659.1, 661.1, 662; 437/228, 233, 238, 241, 245; 310/40 R, 40 MM, 261, 262, 263–268

[56] References Cited
U.S. PATENT DOCUMENTS

| | | | |
|---|---|---|---|
| 4,740,410 | 4/1988 | Muller et al. | 156/656 X |
| 4,997,521 | 3/1991 | Howe et al. | 156/651 |
| 5,043,043 | 8/1991 | Howe et al. | 156/657 X |

Primary Examiner—William A. Powell
Attorney, Agent, or Firm—Nola Mae McBain

[57] ABSTRACT

A method of fabricating a micromechanical structure of a rod enclosed by a casing and able to both slide and rotate in the casing is described. The rod is formed on a substrate by growing a cylinder into a wall. The wall is then removed leaving the cylinder. The cylinder is coated with a sacrificial layer and a structural layer. The structural layer is patterend to form the casing and the sacrificial layer is removed.

5 Claims, 3 Drawing Sheets

MANUFACTURE OF A MICROMECHANICAL ELEMENT WITH TWO DEGREES OF FREEDOM

This application is related to applicant's copending U.S. applications Ser. No. 07/725,176 (U.S. Pat. No. 5,151,153) Manufacture of a Suspended Micromechanical Element and Ser. No. 07/725,174 (U.S. Pat. No. 5,149,397) Fabrication Methods of Micromechanical Elements filed concurrently herewith.

BACKGROUND OF THE INVENTION

This invention relates generally to micromechanical elements, such as movable joints, gears, and sliders and more particularly concerns fabrication methods for making high precision micromechanical elements.

Micromechanical elements with joints that slide or rotate have many uses in miniature pin joints, gears, cranks, slides, and other mechanisms. These elements can be made in a variety of ways. In U.S. Pat. No. 4,740,410 by Muller et al., micromechanical sliding or rotating elements are made by following the process steps of:

1) depositing a sacrificial layer of glass on a substrate,
2) depositing and forming a structural layer of polysilicon for the sliders or gears,
3) depositing a second sacrificial layer of glass,
4) depositing and forming a second structural layer of polysilicon for the rails or pins,
5) removing the sacrificial layers to free the gears and sliders from both the substrate and the pins and rails.

This process results in fixed axle pin joints or fixed rail sliders. Once loosened, the fixed gears and sliders rest on the substrate. In operation, undesirable amounts of friction are generated between the gears and sliders, and the substrate.

A process for making self-constraining joints is also disclosed in Muller et. al. Self-constraining joints may slide and rotate at the same time. These joints are constructed using a small variation of the basic process discussed above. The self-constraining joints are differentiated from the fixed joints by constructing a flange on the pins and rails underneath the gears and sliders to keep them in place. The pins and rails can either be fixed to the substrate or left free to slide across the substrate. The pins and rails are constructed using a portion of the normally first sacrificial glass layer to form the pin or rail and the first structural polysilicon layer to form the flange. The flange is formed with an etch undercut process. Etch undercutting processes are in general not easily controllable. The glass/polysilicon joint is also the weakest part of the structure and tends to break under stress.

Further information about this process can also be found in a paper by Muller et al:

"Integrated Movable Micromechanical Structures for Sensors and Actuators", IEEE Transactions on Electron Devices Vol. 35, No. 6, June 1988.

SUMMARY OF THE INVENTION

A cylindrical self-constrained micromechanical element is built. First, a cylinder is built on a substrate but separated from it by a small layer of nitride. The cylinder is then covered with a relatively uniform sacrificial layer. A structural layer is then deposited on the sacrificial layer and fabricated into a casing around the cylinder. When the sacrificial layer is removed the cylinder is free to both slide and rotate within the casing. Again, by using a sacrificial layer to define the shape of the structural layer, a casing can be built around the cylinder that conforms to the shape of the cylinder.

DETAILED DESCRIPTION OF THE INVENTION

All of the process steps for deposition of materials, etching and patterning are known in the art. Therefore, the description will focus on the order and results of each step and not on the specific details required to perform each step.

The micromechanical elements are built upon a substrate. In this embodiment, silicon is used for the substrate. Silicon is ideal since it is not damaged during high temperature process steps. Other materials, such as ceramics or some metals, could be substituted.

This is a process for a self-constraining joint is a rod or cylindrical structure that may slide and/or rotate within a casing.

Figure 1:
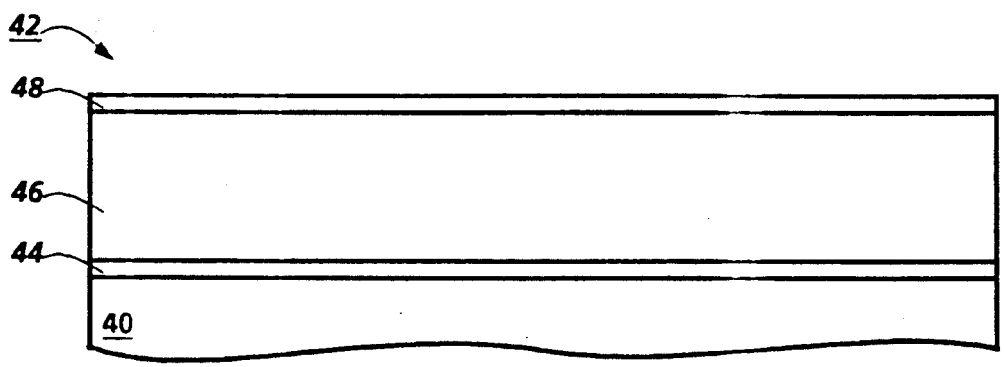
FIG. 1 shows a cross sectional view of a substrate after first and second nitride deposition and doped polysilicon deposition.

The micromechanical elements are built upon a substrate 40. In this embodiment, silicon is used for the substrate 40, although other semiconductor materials are equally appropriate. FIG. 1 illustrates the substrate 40 after depositing the first structural layer 42. The first structural layer 42 comprises of three layers, a first nitride layer 44, a doped polysilicon layer 46, and a second nitride layer 48.

Figure 2:
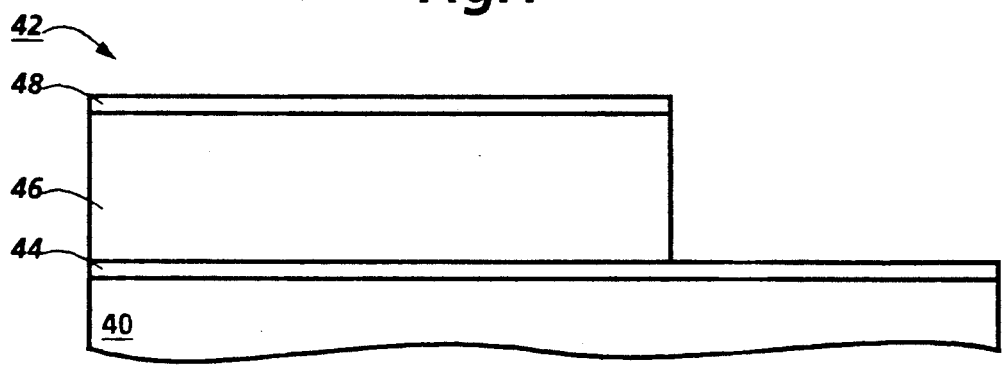
FIG. 2 shows a cross sectional view of the substrate of FIG. 1 after masking and etching the second nitride layer and the doped polysilicon layer.

The first structural layer 42 undergoes two phases of patterning. The first step is done using conventional photoresist and etching processes and the results are shown in FIG. 2. When this step is completed, the remaining first structural layer 42 will define where the self-constrained structure will be on the substrate 40.

The second patterning phase is oxidation. An oxide bumper 50 is grown on the doped polysilicon layer 46 using a conventional oxidation process. The oxide grows on the exposed edge or wall of the doped polysilicon layer 46. The oxide bumper 50 grows both inward and outward in a curved shape since the constraints put on it from the first and second nitride layers 44 and 48 control the shape of the bumper. The oxidation rate will be slowest at the interface of the doped polysilicon layer 46 with each of the nitride layers 44 and 48. The oxide bumper 50 is grown until the profile of the oxide growth is circular. Oxidation rates can be controlled by changing the dopant profile of the doped polysilicon layer 46 either by ion implantation or by controlling in situ dopant in the doped polysilicon layer 46. Since control of polysilicon oxidation rates is known, the depth and profile of the oxide bumper 50 can be precisely controlled. The growth and control of oxide bumpers is discussed in U.S. Pat. Nos. 4,400,866 and 4,375,643 by Bol and Keming, both titled Application of Grown Oxide Bumper Insulators to a High Speed VLSI SASMEFET, incorporated by reference herein. Since the control of polysilicon oxidation rates is known, the size and shape of the oxide bumper can be precisely controlled.

Figure 3:
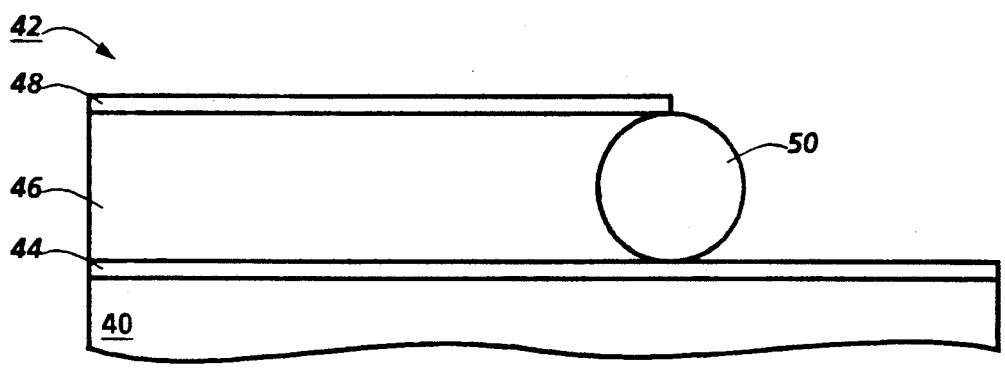
FIG. 3 shows a cross sectional view of the substrate of FIG. 2 after an oxide bumper is grown.

The oxide bumper is grown as shown in FIG. 3. In this sequence, attainment of a near circular oxide bumper is important.

Figure 4:
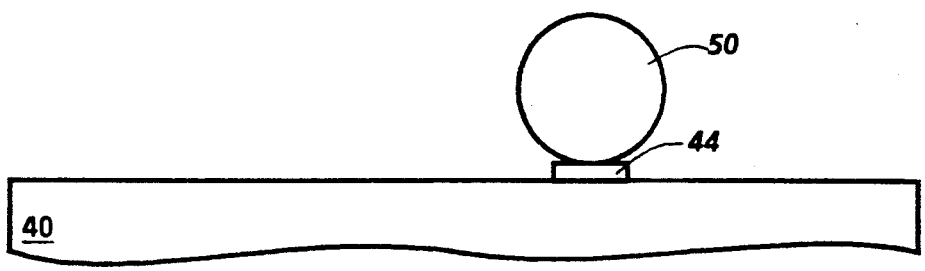
FIG. 4 shows a cross sectional view of the substrate of FIG. 3 after the first and second nitride layers and the doped polysilicon layer has been etched.

As shown in FIG. 4, most of the first structural layer 42 is removed and the oxide bumper 50 remains separated from the substrate by a small portion of nitride layer 44 which also remains. The oxide bumper 50 will become a rod that can move inside a casing.

Figure 5:
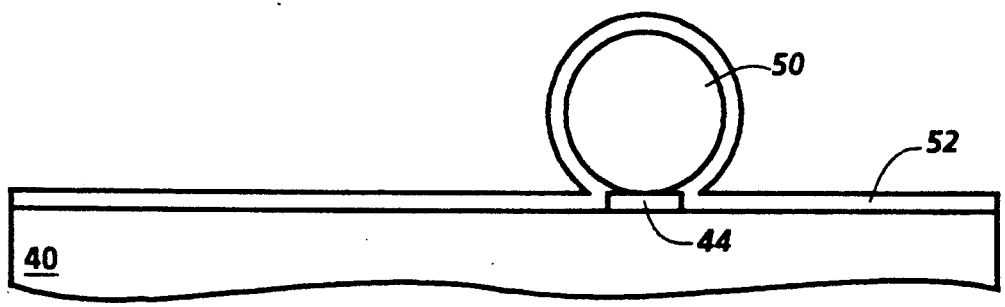
FIG. 5 shows a cross sectional view of the substrate of FIG. 4 after deposition of a sacrificial layer.
Figure 6:
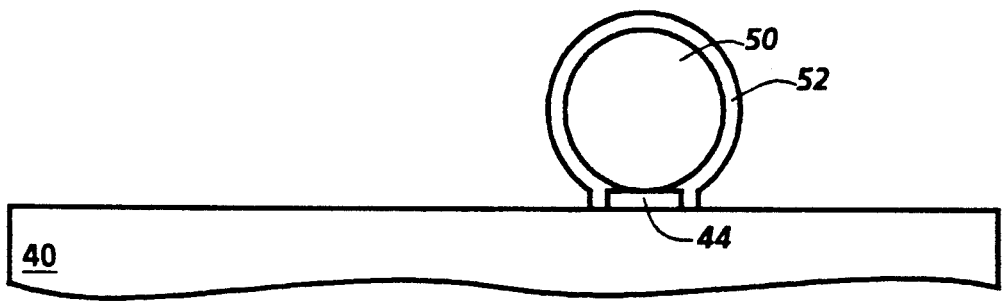
FIG. 6 shows a cross sectional view of the substrate of FIG. 5 after the sacrificial layer has been patterned.

The next step is covering the oxide bumper 50 with a sacrificial nitride layer 52 as shown in FIG. 5. In this embodiment a nitride layer is deposited by conventional means. The nitride is then patterned using the same photoresist and etching technique used to pattern the first structural layer 42 in FIG. 2B. The excess nitride is removed and the result is shown in FIG. 6. The entire oxide bumper 50 is covered with a nitride layer 52 and separated from the substrate 40 by nitride.

Figure 7:
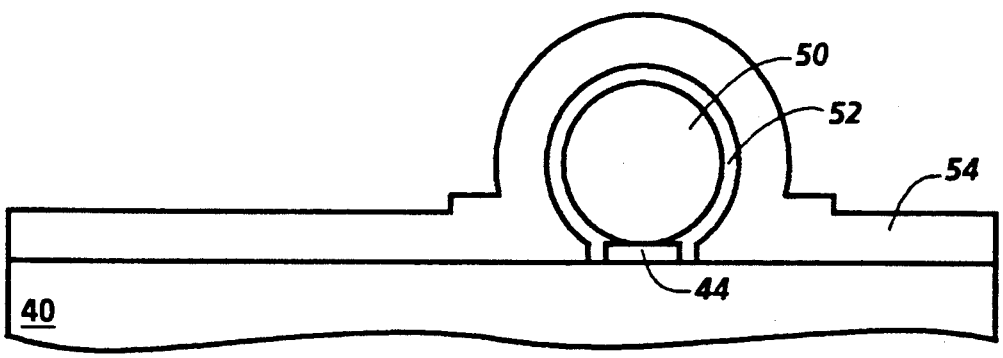
FIG. 7 shows a cross sectional view of the substrate of FIG. 6 after deposition of a structural layer.

The structure is now ready for deposition of the second structural layer 54, as shown in FIG. 7. Polysilicon has been used in this embodiment although other materials are also appropriate. The second structural layer 54 is separated from the oxide bumper 50 by the sacrificial layer 52.

Figure 8:
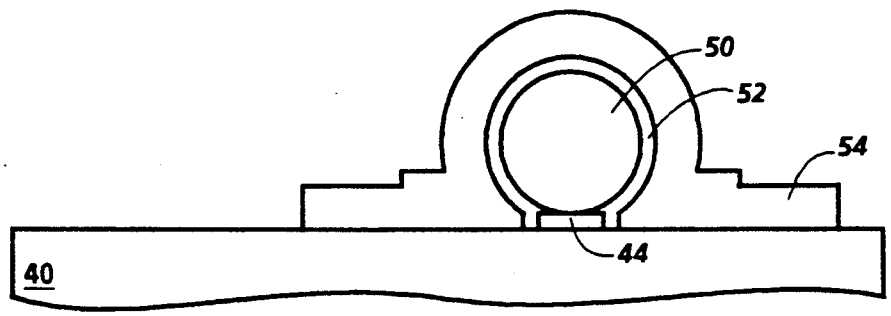
FIG. 8 shows a cross sectional view of the substrate of FIG. 7 after patterning the structural layer.

Once the second structural layer 54 has been deposited it is ready for patterning. Polysilicon is easily patterned by the conventional procedures of masking and etching that were used in previous steps to pattern the first structural layer 42 and the sacrificial layer 52. FIG. 8 shows the device after patterning the second structural layer 54. A rod 56 that can slide or rotate in a casing 58 has been finished except for the etching away of the sacrificial layer 52.

Figure 9:
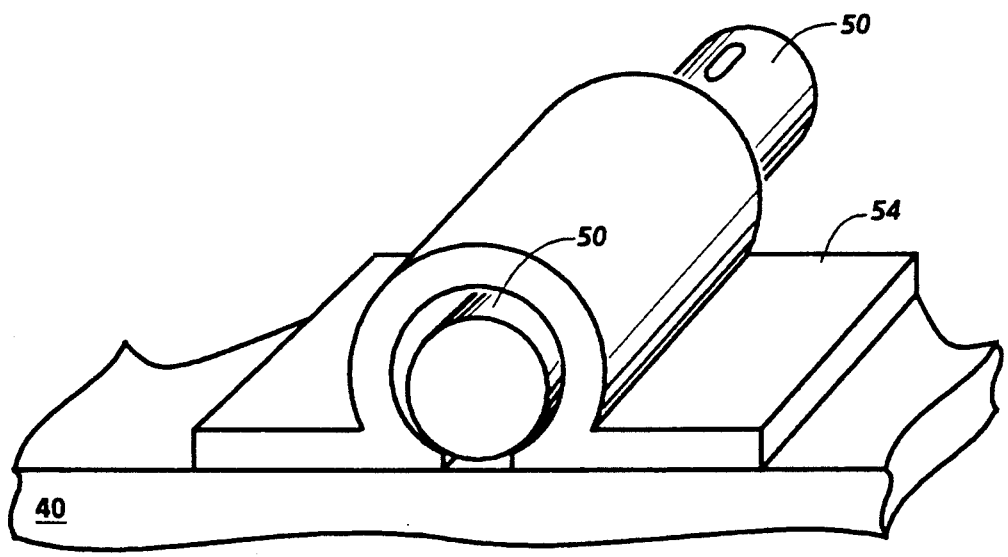
FIG. 9 shows an perspective view of a cylinder that slides in a casing as a result of the process steps shown in FIGS. 1-9.

The final step, shown in FIG. 9, is a nitride etch to wash out the sacrificial layer 52. This step frees the rod 56 from its casing 58 and the substrate 40.

While the present invention has been described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

What is claimed is:

1. A process for making a micromechanical device on a member comprising:
   providing a member;
   forming a first layer of material upon said member that is different from the member material;
   forming a wall of material upon said first layer that is different than said first layer;
   forming a cylindrical bumper onto a portion of said first layer and into said wall forming a convexo-concave relationship with said wall;
   etching said wall and a portion of said first layer to remove the same from said member, from said cylindrical bumper and from a portion of said first layer which is interposed between said cylindrical bumper and said member to which the cylindrical bumper is attached;
   forming a sacrificial layer on said portion of said first layer interposed between said cylindrical bumper and said member, on said cylindrical bumper and on a portion of said member;
   forming a structural layer on said sacrificial layer and said member;
   patterning said structural layer to form a casing structure for movement of said cylindrical bumper relative to said casing structure and to expose portions of said sacrificial layer; and
   etching said sacrificial layer and said first layer interposed between said cylindrical bumper and said member to release said cylindrical bumper from said casing structure, to release said cylindrical bumper from said member, and providing for relative movement between said cylindrical bumper and said casing structure.

2. The process of claim 1, wherein:
   said member is a substrate;
   said first layer is nitride;
   said wall is doped polysilicon; and
   said cylindrical bumper is oxide.

3. The process of claim 2, wherein said sacrificial layer comprises one of silicon oxide, silicon nitride, or polyimide, and said structural layer comprises one of polysilicon, silicon nitride, metal silicide, or metal.

4. A process for making a micromechanical device on a substrate, comprising:
   providing a substrate;
   forming a first nitride layer upon said substrate;
   forming a doped polysilicon layer upon said first nitride layer;
   forming a second nitride layer upon said doped polysilicon layer;
   masking and etching said second nitride layer and said doped polysilicon layer to expose at least a portion of said first nitride layer and to form a structure with a wall protruding from said exposed portion of said first nitride layer;
   growing a cylindrical oxide bumper onto a portion of said exposed portion of said first nitride layer and into said wall of said protruding structure and forming a convexo-concave relationship with said wall;
   etching the remaining said doped polysilicon layer, said second nitride layer and a portion of said first nitride layer to remove the same from said substrate, from said cylindrical oxide bumper and from a portion of said first nitride layer interposed between said cylindrical oxide bumper and said substrate to which the oxide bumper is attached;
   forming a sacrificial layer on said portion of said first nitride layer interposed between said cylindrical oxide bumper and the substrate, on said cylindrical oxide bumper, and on a portion of said substrate,;
   forming a structural layer on said sacrificial layer and said substrate;
   patterning said structural layer to form a casing structure for movement of say cylindrical oxide bumper relative to said casing structure and to expose portions of said sacrificial layer; and etching said sacrificial layer and said nitride layer interposed between said cylindrical oxide bumper and said substrate to release said cylindrical oxide bumper from said casing structure, to release said cylindrical oxide bumper from said substrate, and providing for relative movement between said cylindrical bumper and said casing structure.

5. The process of claim 4, wherein said sacrificial layer comprises one of silicon oxide or silicon nitride, and said structural layer comprises one of polysilicon, silicon nitride, metal silicide, or metal.

* * * * *